(12) United States Patent
Tanaka

(10) Patent No.: US 9,166,164 B2
(45) Date of Patent: Oct. 20, 2015

(54) METHOD FOR MANUFACTURING NONVOLATILE SEMICONDUCTOR STORAGE DEVICE AND NONVOLATILE SEMICONDUCTOR STORAGE DEVICE

(71) Applicant: KABUSHIKI KAISHA TOSHIBA, Minato-ku (JP)

(72) Inventor: Toshiharu Tanaka, Yokkaichi (JP)

(73) Assignee: KABUSHIKI KAISHA, Minato-ku (JP)

( * ) Notice: Subject to any disclaimer, the term of this patent is extended or adjusted under 35 U.S.C. 154(b) by 0 days.

(21) Appl. No.: 14/482,893

(22) Filed: Sep. 10, 2014

(65) Prior Publication Data

US 2014/0377932 A1    Dec. 25, 2014

Related U.S. Application Data

(62) Division of application No. 13/584,361, filed on Aug. 13, 2012, now Pat. No. 8,872,147.

(30) Foreign Application Priority Data

Sep. 22, 2011 (JP) ................................ 2011-208165

(51) Int. Cl.
*H01L 21/00* (2006.01)
*H01L 45/00* (2006.01)
*H01L 27/102* (2006.01)
*H01L 27/24* (2006.01)

(52) U.S. Cl.
CPC ........ *H01L 45/1608* (2013.01); *H01L 27/1021* (2013.01); *H01L 27/2436* (2013.01); *H01L 27/2463* (2013.01); *H01L 27/2481* (2013.01);
(Continued)

(58) Field of Classification Search
CPC ............ H01L 27/2436; H01L 27/2481; H01L 45/1233; H01L 45/146; H01L 45/1608; H01L 45/1675; H01L 21/1021; H01L 27/2463; H01L 45/04; H01L 45/1633; H01L 27/2409; H01L 45/08; H01L 45/1246; H01L 45/145
USPC ............ 438/95, 104, 622, 382, 697; 257/2–4, 257/773–774, E45.001, E47.001, E21.09
See application file for complete search history.

(56) References Cited

U.S. PATENT DOCUMENTS

| 2004/0155301 A1 | 8/2004 | Zhang |
| 2008/0175032 A1 | 7/2008 | Tanaka et al. |

(Continued)

FOREIGN PATENT DOCUMENTS

| JP | 2010-67942 | 3/2010 |
| JP | 2010-225850 | 10/2010 |

(Continued)

*Primary Examiner* — Mark A Laurenzi
(74) *Attorney, Agent, or Firm* — Oblon, McClelland, Maier & Neustadt, L.L.P.

(57) ABSTRACT

A method for manufacturing a nonvolatile semiconductor storage device according to an embodiment includes laminating a first wire extending in a first direction, and a film made into a variable resistance element made of a metallic material, which are laminated in order on a semiconductor substrate, dividing, into a plurality of pieces, the film made into the variable resistance element, in the first direction and a second direction, forming an interlayer insulating film between the plurality of pieces formed by dividing the film made into the variable resistance element in the second direction, and oxidizing the metallic material of the film made into the variable resistance element, and laminating an upper electrode and a second wire extending in the second direction, which are laminated in order on the film made into the variable resistance element and the interlayer insulating film.

13 Claims, 15 Drawing Sheets

(52) U.S. Cl.
CPC ............ *H01L 45/04* (2013.01); *H01L 45/1233* (2013.01); *H01L 45/146* (2013.01); *H01L 45/1633* (2013.01); *H01L 45/1675* (2013.01)

(56) References Cited

U.S. PATENT DOCUMENTS

2009/0001343 A1    1/2009    Schricker et al.
2009/0001345 A1    1/2009    Schricker et al.
2009/0121208 A1    5/2009    Nagashima et al.
2010/0038617 A1    2/2010    Nakajima et al.
2010/0243980 A1    9/2010    Fukumizu

FOREIGN PATENT DOCUMENTS

JP    2010-232214         10/2010
WO    WO 2009/005700 A2    1/2009

VR: e.g. HfO$_2$, NiO$_2$, MnO, TiO$_2$
NO: e.g. N+Poly Si/N−Poly Si/P+Poly Si
, P+Poly Si/N−Poly Si/N+Poly Si VR: e.g. HfO$_2$, NiO$_2$, MnO, TiO$_2$
NO: e.g. N+Poly Si/N−Poly Si/P+Poly Si
, P+Poly Si/N−Poly Si/N+Poly Si VR1,VR2 : e.g. HfO$_2$, NiO$_2$, MnO, TiO$_2$
NO : e.g. N+Poly Si/N-Poly Si/P+Poly Si
, P+Poly Si/N-Poly Si/N+Poly Si VR1,VR2 : e.g. HfO$_2$, NiO$_2$, MnO, TiO$_2$
NO : e.g. N+Poly Si/N-Poly Si/P+Poly Si
, P+Poly Si/N-Poly Si/N+Poly Si

METHOD FOR MANUFACTURING NONVOLATILE SEMICONDUCTOR STORAGE DEVICE AND NONVOLATILE SEMICONDUCTOR STORAGE DEVICE

CROSS-REFERENCE TO RELATED APPLICATIONS

This application is a divisional of U.S. application Ser. No. 13/584,361 filed Aug. 13, 2012, and is based upon and claims the benefit of priority from the prior Japanese Patent Application No. 2011-208165, filed on Sep. 22, 2011, the entire contents of each of which are incorporated herein by reference.

FIELD

Embodiments relate to a method for manufacturing nonvolatile semiconductor storage device and a nonvolatile semiconductor storage device.

BACKGROUND

In recent years, a resistance-change memory cell including a variable resistance element and a non-ohmic element (diode and the like) attracts attention. This memory cell is a cross-point memory cell which can be formed in a pillar shape between two crossing selection wires. Therefore, this can easily achieve higher-level integration and large capacity.

In the past, this resistance-change memory cell is manufactured by the following process when the memory cell is processed. The process includes: (1) depositing a memory cell material, (2) depositing a mask material for processing the memory cell material, (3) patterning the mask material by photolithography, and (4) anisotropically etching the memory cell material.

However, this process not only requires complicated processing steps because it is necessary to process the memory cell material at a time, but also requires the mask material having a sufficient thickness that can withstand the anisotropic etching. Therefore, this increases the aspect ratio during the anisotropic etching, and there is a problem in that it is impossible to ensure processing margin.

DETAILED DESCRIPTION

A method for manufacturing a nonvolatile semiconductor storage device according to an embodiment includes laminating a first wire extending in a first direction, a film made into a first non-ohmic element, and a film made into a first variable resistance element made of a metallic material, which are laminated in order on a semiconductor substrate extending in the first direction and a second direction intersecting the first direction, dividing into a plurality of pieces, the film made into the first variable resistance element and the film made into the first non-ohmic element, in the first direction and the second direction, forming a first interlayer insulating film between the plurality of pieces formed by dividing the film made into the first variable resistance element and the film made into the first non-ohmic element in the first direction and the second direction, planarizing an upper surface of the first interlayer insulating film and the film made into the first variable resistance element, oxidizing the metallic material of the film made into the first variable resistance element, and laminating a first upper electrode extending in the second direction and a second wire extending in the second direction, which are laminated in order on the film made into the first variable resistance element and the first interlayer insulating film.

A nonvolatile semiconductor storage device according to an embodiment will be hereinafter explained with reference to drawings.

First Embodiment

Overall Configuration

Figure 1:
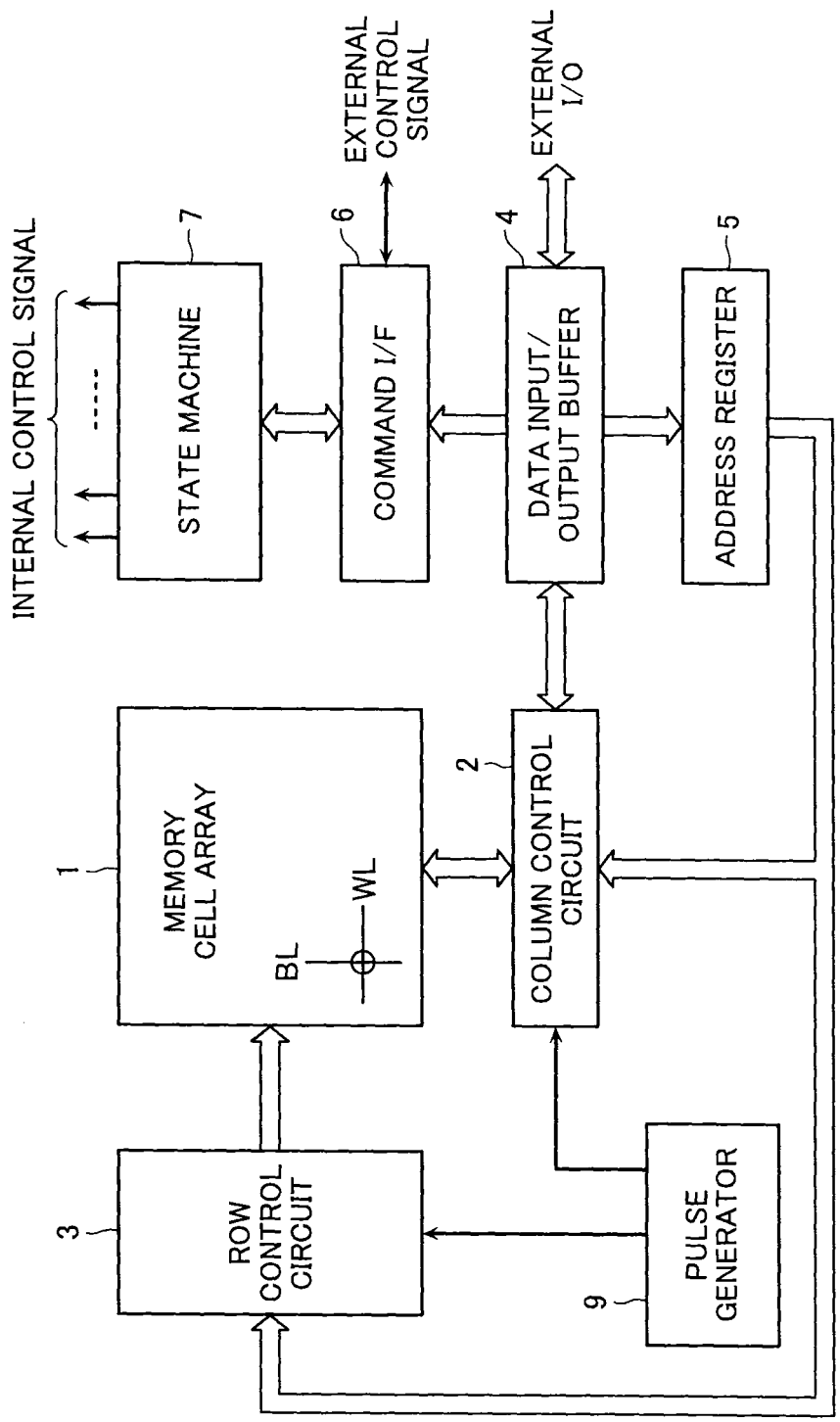
FIG. 1 is a block diagram illustrating a nonvolatile semiconductor storage device according to a first embodiment.

FIG. 1 is a block diagram illustrating a nonvolatile semiconductor storage device according to the first embodiment.

This nonvolatile semiconductor storage device includes a memory cell array 1 in which memory cells using ReRAM (variable resistance element) later explained are arranged in a matrix form. A column control circuit 2 is provided at a position adjacent to a direction of a bit line BL of the memory cell array 1. The column control circuit 2 controls the bit lines BL of the memory cell array 1, writes data to a memory cell, and reads data from a memory cell. A row control circuit 3 is provided at a position adjacent to a direction of a word line WL of the memory cell array 1. The row control circuit 3 selects a word line WL of the memory cell array 1 and supplies a voltage required for writing data to or reading data from a memory cell. It should be noted that the column control circuit 2 and the row control circuit 3 are included in the data writing unit.

The data input/output buffer 4 is connected via an I/O line to an external host, not shown. The data input/output buffer 4 receives writing data, outputs reading data, and exchanges address data and command data. The data input/output buffer 4 transmits the received writing data to the column control circuit 2, and receives the data read from the column control circuit 2 and outputs the data to the outside. An address supplied from the outside to the data input/output buffer 4 is transmitted via an address register 5 to the column control circuit 2 and the row control circuit 3. A command supplied from the host to the data input/output buffer 4 is transmitted to a command interface 6. The command interface 6 receives an external control signal from the host, and determines whether the data input to the data input/output buffer 4 are writing data, a command, or an address. When the data are determined to be a command, the command is received, and transfers the command as a command signal to the state machine 7. The state machine 7 manages the entire nonvolatile semiconductor storage device. For example, the state machine 7 receives a command from the host, performs reading, writing, and data input/output management. The external host can receive status information managed by the state machine 7, and can determine operation result. This status information is also used for writing control.

Further, the state machine 7 controls a pulse generator 9. With this control, the pulse generator 9 can output a pulse with any given voltage and any given timing. Specifically, the state machine 7 receives an address given from the outside via the address register 5, determines a memory cell to be accessed, and uses a parameter corresponding to the memory cell to control the height/width of a pulse given by the pulse generator 9. In this case, the formed pulse can be transferred to any given wire selected by the column control circuit 2 and row control circuit 3.

It should be noted that a peripheral circuit other than the memory cell array 1 can be formed on a silicon substrate immediately below the memory cell array 1, so that the size of chip area of the semiconductor storage device can be made substantially the same as the size of area of the memory cell array 1.

<Structure of Memory Cell Array>

Figure 2:
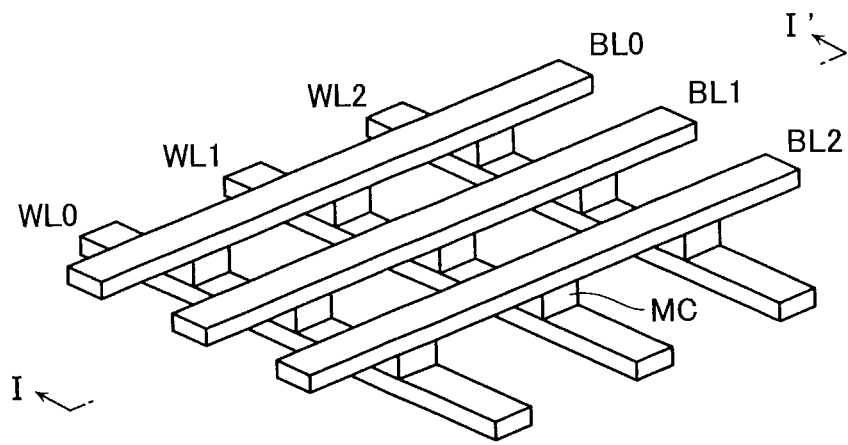
FIG. 2 is a perspective view illustrating a portion of a memory cell array of the nonvolatile semiconductor storage device according to the embodiment.
Figure 3:
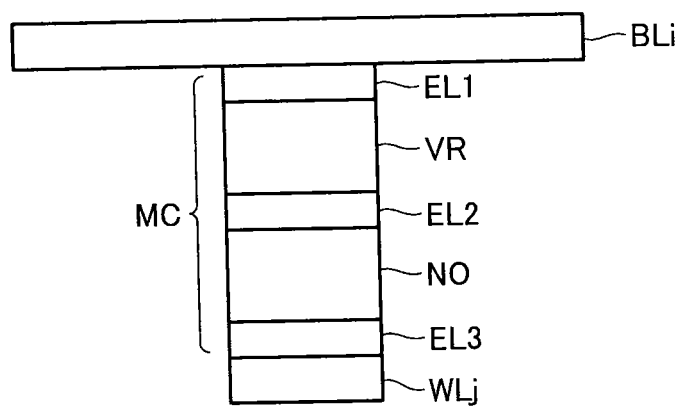
FIG. 3 is a cross sectional view illustrating one memory cell taken along line I-I' of FIG. 2 and seen in an arrow direction.

FIG. 2 is a perspective view illustrating a portion of the memory cell array 1. FIG. 3 is a cross sectional view illustrating one memory cell, which is seen in an arrow direction, taken along line I-I' in FIG. 2.

Multiple word lines WL0 to WL2 are arranged in parallel, and multiple bit lines BL0 to BL2 are arranged in parallel so as to cross the word lines WL0 to WL2. A memory cell MC is provided at each of these crossing points to be sandwiched between both of the wires.

As shown in FIG. 3, the memory cell MC is made of a series-connected circuit including a variable resistance element VR and a non-ohmic element NO.

Electrodes EL1, EL2 are provided as the variable resistance element VR. The electrodes EL1, EL2 can change resistance values by means of an electric current, heat, chemical energy, and the like when voltages are applied, and function as a barrier metal and an adhesive layer at the upper and lower sides. As shown in FIG. 3, in addition, it may also be possible to insert a barrier metal layer EL3, a buffer layer, an adhesive layer, and the like.

The variable resistance element VR is a complex compound including positive ions serving as transition elements. A complex compound of which resistance value changes according to movement of positive ions (ReRAM) can be used as the variable resistance element VR.

Figure 4A:
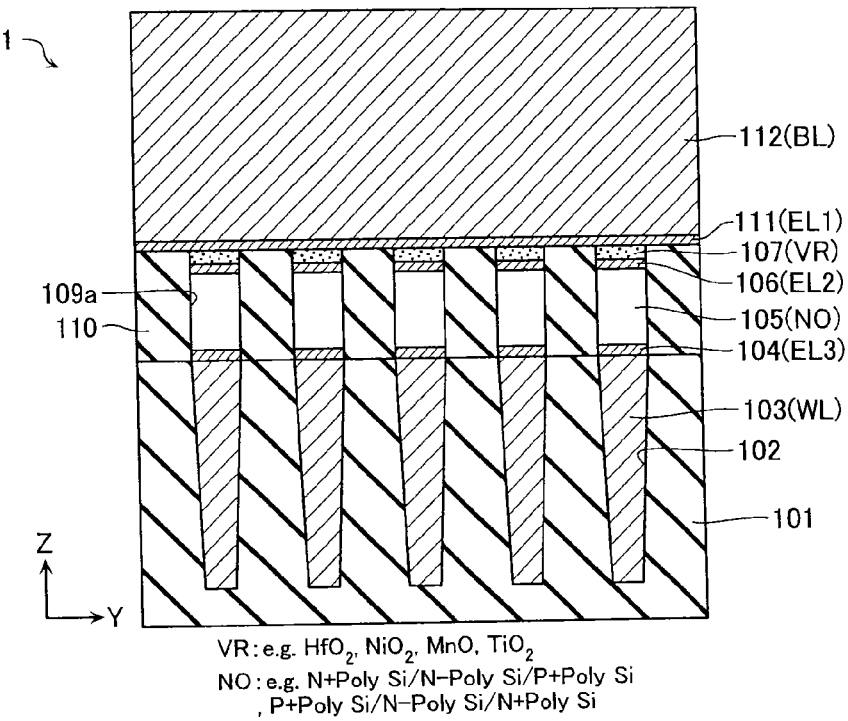
FIG. 4A is a cross sectional view illustrating the memory cell array of the nonvolatile semiconductor storage device according to the embodiment.
Figure 4B:
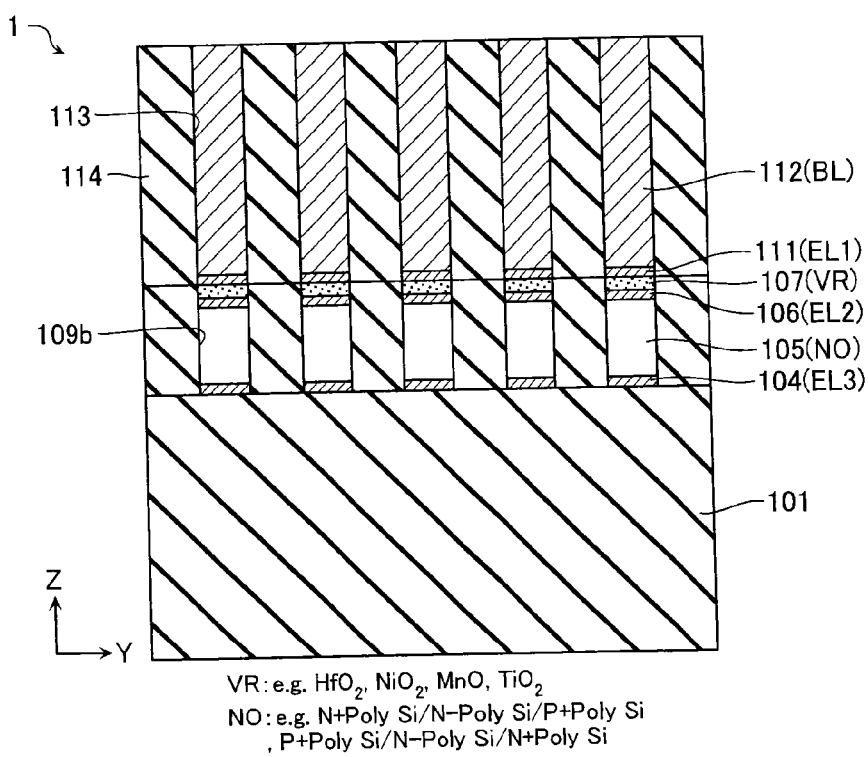
FIG. 4B is a cross sectional view illustrating the memory cell array of the nonvolatile semiconductor storage device according to the embodiment.

FIGS. 4A and 4B are cross sectional views illustrating a portion of the memory cell array. In the figures, X, Y, and Z respectively denote an extension direction (first direction) of the word lines WL (first wires), an extension direction (second direction) of the bit lines BL (second wires), and a direction in which the nonvolatile semiconductor storage device are laminated. That is, FIG. 4A shows a cross section taken along Y-Z of the memory cell array 1. FIG. 4B denotes a cross section taken along X-Z of the memory cell array 1.

The memory cell array 1 according to the present embodiment includes an interlayer insulating film 101 formed on a silicon substrate (not shown) formed with CMOS transistors of a peripheral circuit and the like. This interlayer insulating film 101 is formed with multiple grooves 102 extending in the X direction, and the multiple word lines WL extending in the X direction to fill the respective grooves 102 are formed therein.

On these multiple word lines WL, the multiple bit lines BL extending in the Y direction are formed. Further, at each crossing point between the multiple word lines WL and the multiple bit lines BL, a memory cell MC is formed.

Each memory cell MC has a barrier metal EL3, a non-ohmic element NO, a lower electrode EL2, a variable resistance element VR, and an upper electrode EL1 which are laminated and formed in order from the word line WL to the bit line BL. Among them, a portion from the barrier metal EL3 to the variable resistance element VR is formed in a pillar shape. The upper electrode EL1 is formed continuously on multiple memory cells MC arranged in the Y direction.

Interlayer insulating films 110 are respectively formed between multiple memory cells MC adjacent to each other in the X direction or the Y direction. The interlayer insulating films 114 are respectively formed between the bit lines BL.

When the memory cell array 1 is made in the structure as shown in FIGS. 4A and 4B, it is possible to use the manufacturing method according to the present embodiment having a large processing margin explained below.

<Method for Manufacturing Memory Cell Array>

Subsequently, the method for manufacturing the memory cell array 1 as shown in FIGS. 4A and 4B will be explained with reference to cross sectional views of the memory cell array 1 as shown in FIGS. 5 to 8. In this explanation, the non-ohmic element NO is a diode.

First, after transistors of a peripheral circuit and the like are formed on a silicon substrate, not shown, the interlayer insulating film 101 is deposited. Subsequently, multiple grooves 102 are formed in a line-and-space pattern (hereinafter referred to as "L/S pattern") extending in the X direction on the interlayer insulating film 101. Thereafter, metallic wire material 103 (film which is made into a first wires) such as W and WN, which is made into word lines WL, are embedded into the grooves 102. Subsequently, a barrier metal material 104' such as TiN which is made into the barrier metals EL3, a diode material 105' (film which is made into a first non-ohmic element) formed by laminating N+Poly Si/N–Poly Si/P+ Poly-Si in order, which is made into diodes (non-ohmic elements NO), and a metallic electrode material 106' such as Ti, TiN which is made into the lower electrodes EL2 are deposited on the interlayer insulating film 101 and metallic wire material 103. It should be noted that the diode material 105' may be formed by laminating P+Poly Si/N–Poly Si/N+Poly Si in order.

Figure 5:
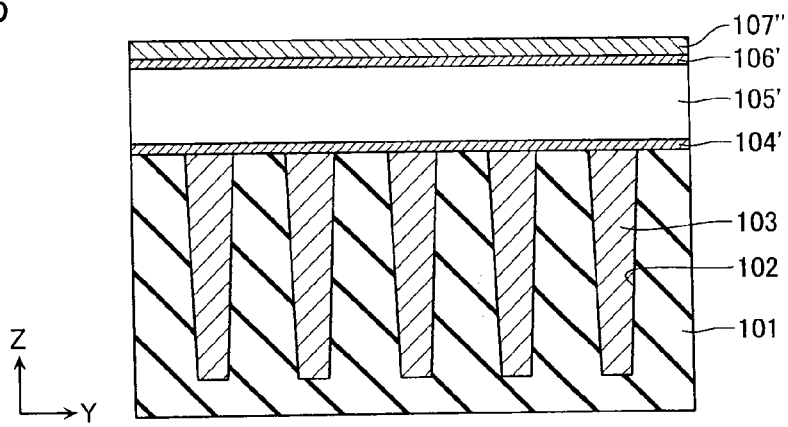
FIG. 5 is a figure illustrating a step of manufacturing the memory cell array of the nonvolatile semiconductor storage device according to the embodiment.

Thereafter, a metallic element material 107" (film which is made into a first variable resistance element), which is made into the variable resistance elements VR, is deposited on the metallic electrode material 106'. This metallic element material 107" has such property that the metallic element material 107" changes into a resistance-change material when oxidized. For example, Hf, Ni, Mn, and Ti can be used as the metallic element material 107". As a result of the above manufacturing steps, the cross section of the memory cell array 1 becomes what is shown in FIG. 5.

Figure 6:
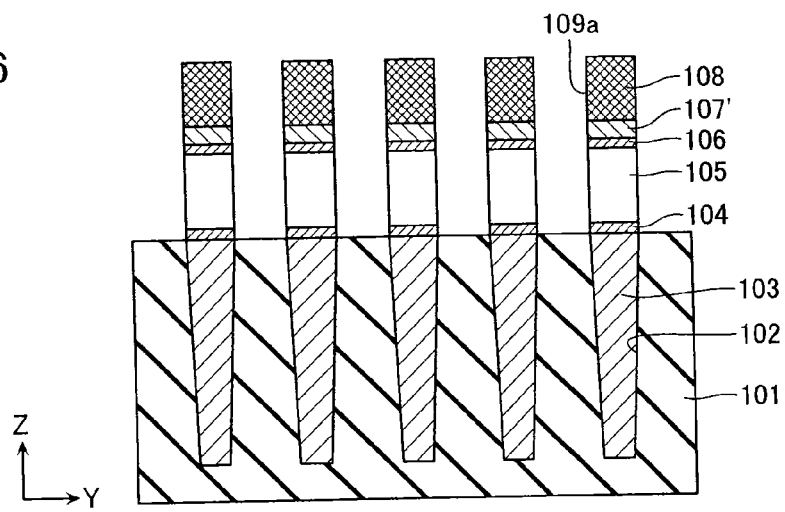
FIG. 6 is a figure illustrating a step of manufacturing the memory cell array of the nonvolatile semiconductor storage device according to the embodiment.

Subsequently, a mask material 108 is deposited that is required to process the barrier metal material 104', the diode material 105', the metallic electrode material 106' and the metallic element material 107". Thereafter, this mask material 108 is patterned into a desired pattern by photolithography. Subsequently, multiple grooves 109a extending in a direction parallel to the X direction and multiple grooves 109b extending in a direction parallel to the Y direction are formed by anisotropic etching in the metallic element material 107", the metallic electrode material 106', the diode material 105', and the barrier metal material 104'. Accordingly, the metallic element material 107', the metallic electrode material 106, the diode material 105, and the barrier metal material 104 are formed to make the pillar-shaped memory cell MC. As a result of the above manufacturing steps, the cross section of the memory cell array 1 becomes what is shown in FIG. 6. It should be noted that the groove 109b is not shown in FIG. 6.

Figure 7:
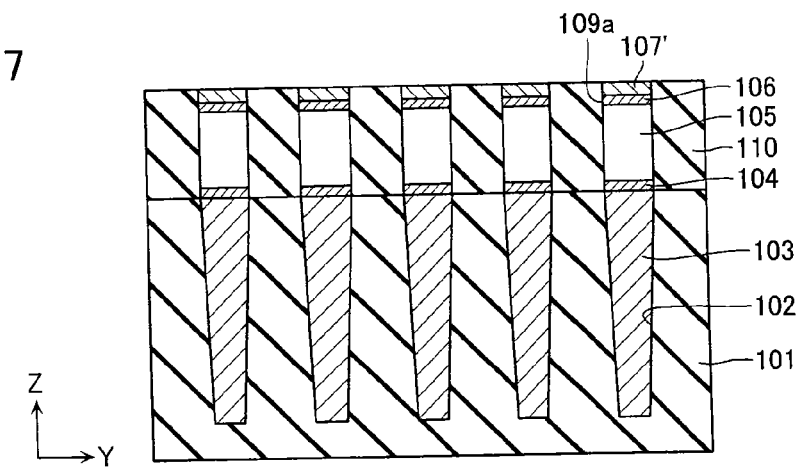
FIG. 7 is a figure illustrating a step of manufacturing the memory cell array of the nonvolatile semiconductor storage device according to the embodiment.

Subsequently, the interlayer insulating film 110 such as HDP-USG and PSZ is embedded in the grooves 109a and 109b formed by the previous anisotropic etching. Subsequently, using the metallic element material 107' as a stopper, the mask material 108 and the interlayer insulating film 110 are smoothed until the upper surface of the metallic element material 107' is exposed. As a result of the above manufacturing steps, the cross section of the memory cell array 1 becomes what is shown in FIG. 7.

Figure 8:
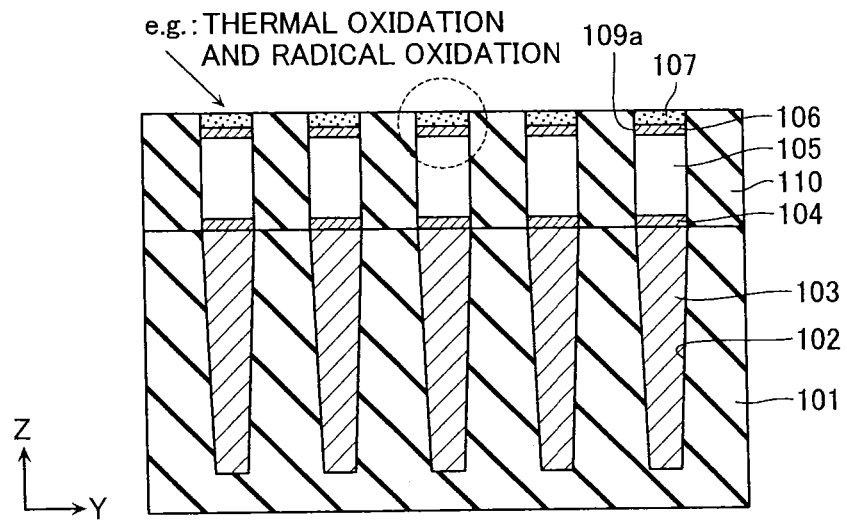
FIG. 8 is a figure illustrating a step of manufacturing the memory cell array of the nonvolatile semiconductor storage device according to the embodiment.

Subsequently, as shown in FIG. 8, the metallic element material 107' such as Hf, Ni, Mn, and Ti is oxidized by thermal oxidation and radical oxidation, and a resistance-change material 107 such as $HfO_2$, $NiO_2$, MnO, and $TiO_2$ is formed.

Figure 9:
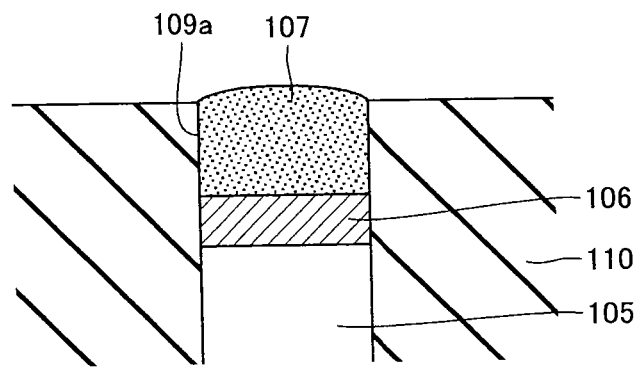
FIG. 9 is a figure enlarging a portion of the cross sectional view as shown in FIG. 8.
Figure 10:
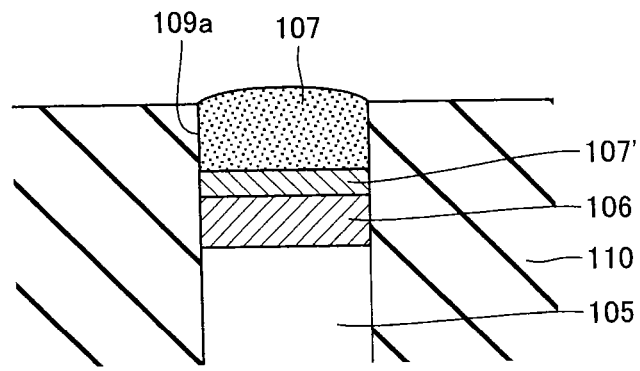
FIG. 10 is a figure enlarging a portion of the cross sectional view as shown in FIG. 8.

It should be noted that FIGS. 9 and 10 are figures enlarging a portion of enclosed by a dotted circle in FIG. 8. As shown in FIG. 9, all of the metallic element material 107' may be oxidized. Alternatively, as shown in FIG. 10, only a portion thereof may be oxidized. As described above, the film thickness of formation of the resistance-change material 107 can be controlled by adjusting a portion of the metallic element material 107' oxidized, and this can reduce variation of the film thickness of the variable resistance element VR (resistance-change material 107) of each of the memory cell MC. It should be noted that the volume of the metallic element material 107' increases as it is oxidized, and therefore, the upper surface of the resistance-change material 107 slightly swells as compared with the upper surface of the interlayer insulating film 110 as shown in FIGS. 9 and 10. In this manner, the upper surface of the interlayer insulating film 110 bulges, which changes the distribution of the electric field. Therefore, it is considered that a filament is likely to be formed in the resistance-change material 107, and it is easy to perform switching.

Subsequently, a metallic electrode material 111' (film which is made into a first upper electrode) such as Ti, TiN which is made into the upper electrodes EL1 and a metallic wire material 112' (film which is made into a second wire) such as W, WN which is made into the bit lines BL are deposited. Thereafter, multiple grooves 113 extending in the Y direction parallel to the direction of the metallic wire material 112' and the metallic electrode material 111' are formed by anisotropic etching. Accordingly, the metallic electrode material 111 which is made into the upper electrodes EL1 and the metallic wire material 112 which is made into the bit lines BL are formed.

Finally, when the interlayer insulating films 114 are embedded into the grooves 113, the memory cell array 1 as shown in FIGS. 4A and 4B constituted by one memory cell layer is completed.

It should be noted that a large-capacity memory cell array 1 made by laminating multiple memory cell layers can be manufactured by repeating the same manufacturing steps as those explained with reference to FIGS. 5 to 10 while further depositing an interlayer insulating film on the metallic wire material 112.

Hereinafter, a method for manufacturing a memory cell array according to a comparative example will be explained as a basis for considering the effects of the method for manufacturing the memory cell array 1 of the nonvolatile semiconductor storage device according to the present embodiment explained above.

Figure 25:
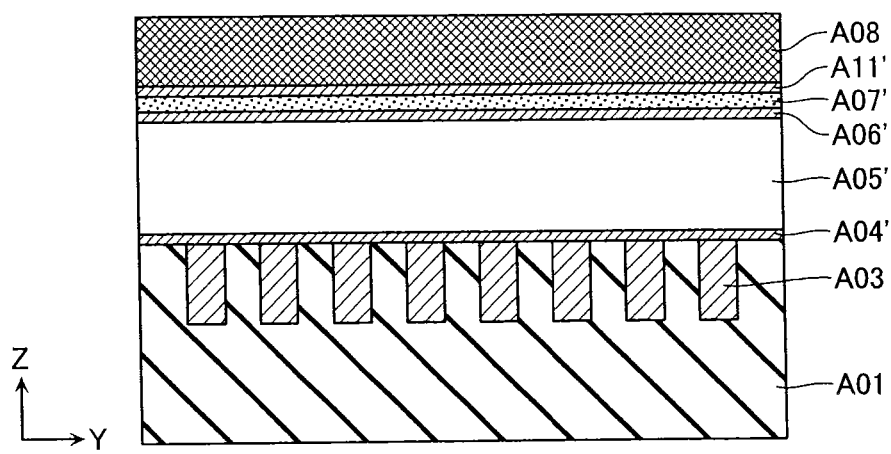
FIG. 25 is a figure illustrating a step of manufacturing a memory cell array of a nonvolatile semiconductor storage device according to a comparative example.
Figure 26:
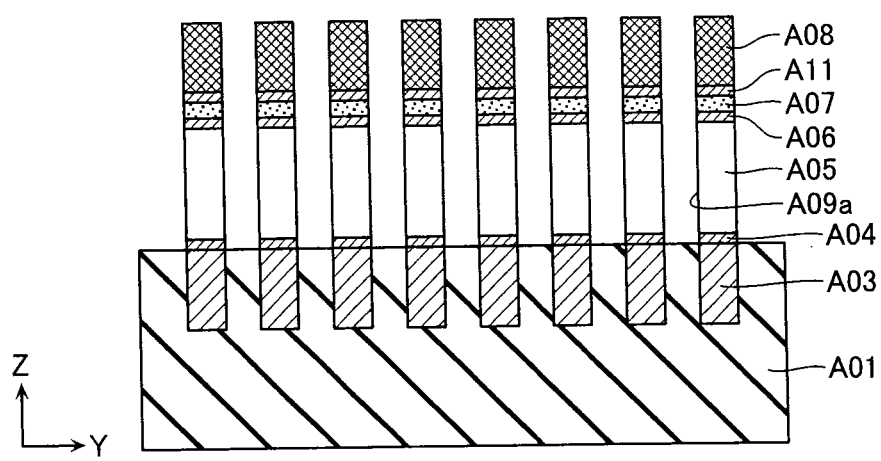
FIG. 26 is a figure illustrating a step of manufacturing the memory cell array of the nonvolatile semiconductor storage device according to the comparative example.

In the method for manufacturing the memory cell array according to the comparative example, a pillar-shaped memory cell is processed according to manufacturing steps as shown in FIGS. 25 and 26.

In other words, in the case of the comparative example, first, as shown in FIG. 25, a barrier metal material A04' which is made into barrier metals EL3, a non-ohmic element material A05' which is made into non-ohmic elements NO, a metallic electrode material A06' which is made into lower electrodes EL2, a resistance-change material A07' which is made into the variable resistance elements VR, and a metallic electrode material A11' which is made into upper electrodes EL3 are deposited on an interlayer insulating film A01 formed with metallic wire materials A03 serving as word lines WL. Then, a mask material A08' for processing these materials is deposited on the metallic electrode material A11'.

Subsequently, as shown in FIG. 26, the mask material A08' is patterned by photolithography, and a mask material A08 of L/S pattern is formed. Thereafter, a body to be processed, which includes the barrier metal material A04+, the non-ohmic element material A05', the metallic electrode material A06', the resistance-change material A07', and the metallic electrode material A11', is processed by anisotropic etching using the mask material A08. Accordingly, the pillar-shaped memory cell MC including a barrier metal material A04, a non-ohmic material A05, a metallic electrode material A06, a resistance-change material A07, and an upper electrode material A11 can be formed.

In this comparative example, however, as shown in FIG. 26, all the materials constituting the memory cell MC are processed by the anisotropic etching at a time, and therefore, it is necessary to prepare the mask material A08 that is thick enough to withstand this anisotropic etching. In this case, the aspect ratio during the anisotropic etching increases, and this increases the difficulty in processing the materials.

Therefore, subsequently, a case will be considered where the metallic electrode material A11' serving as the upper electrode EL1 is deposited after the anisotropic etching. In this case, the structure of the body to be processed can be simplified only in the upper electrode material A11'.

In this manufacturing method, however, the uppermost layer of the body to be processed is made into the resistance-change material A07 (oxidized metal) including the same type of material as that of the mask material A08. In this case, the resistance-change material A07 does not function as a stopper in the step of planarizing the upper surface of the resistance-change material A07 performed later, and there is a problem in that the resistance-change material A07 is cut down together with the mask material A08.

When the present embodiment is compared with the comparative example with regard to this point, the structure of the body to be processed can be simplified during the processing of the memory cell, and therefore, the mask material 108 can be thinned. As a result, the aspect ratio during the anisotropic etching is reduced, and this can not only improve the margin of collapse of the body to be processed, but also improve the margin of embedding of an interlayer insulating film between the memory cells thereafter executed. In addition, the metallic element material 107' functions as the stopper in the step of planarizing the upper surface of the metallic element material 107', and therefore, the metallic element material 107' is not cut down more than necessary.

In other words, as compared with the comparative example, the present embodiment can provide the method for manufacturing the nonvolatile semiconductor storage device and the nonvolatile semiconductor storage device in which the processing margin of the memory cell array is improved.

Second Embodiment

In the first embodiment, the nonvolatile semiconductor storage device having the bit lines BL and the word lines WL for each memory cell layer has been explained. In the second embodiment, a nonvolatile semiconductor storage device in which bit lines BL or word lines WL are shared by two adjacent memory cell layers will be explained.

<Structure of Memory Cell Array>

Figure 11A:
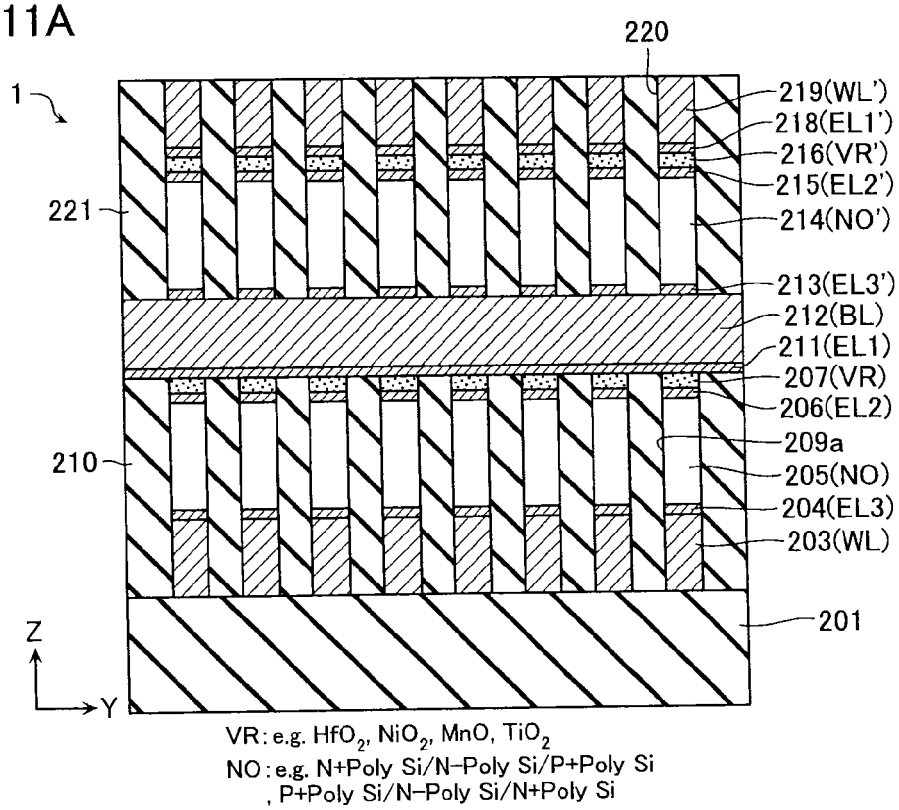
FIG. 11A is a cross sectional view illustrating a memory cell array of a nonvolatile semiconductor storage device according to a second embodiment.
Figure 11B:
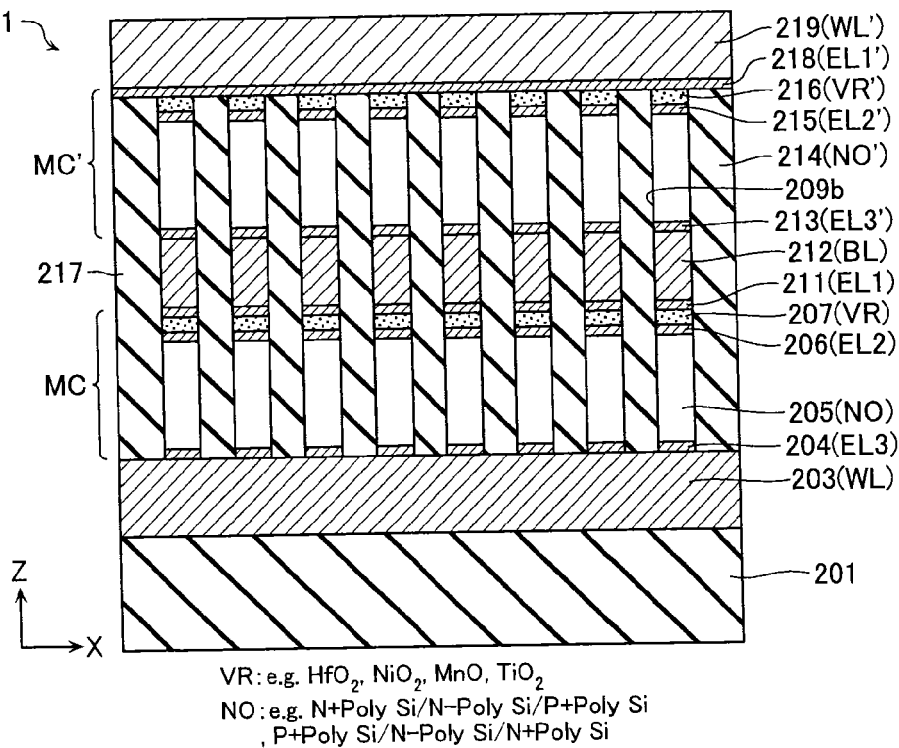
FIG. 11B is a cross sectional view illustrating the memory cell array of the nonvolatile semiconductor storage device according to the embodiment.

FIGS. 11A and 11B are cross sectional views illustrating a portion of a memory cell array 1 of a nonvolatile semiconductor storage device according to the second embodiment. FIG. 11A is a cross section of the memory cell array 1 taken along Y-Z. FIG. 11B is a cross section of the memory cell array 1 taken along X-Z.

The memory cell array 1 according to the present embodiment includes an interlayer insulating film 201 formed on a silicon substrate (not shown) formed with CMOS transistors of a peripheral circuit and the like. On the interlayer insulating film 201, multiple word lines WL (first wires) extending in the X direction (first direction) are formed.

On these multiple word lines WL, multiple bit lines BL (second wires) extending in the Y direction are formed. Further, at each crossing point between the multiple word lines WL and the multiple bit lines BL, a memory cell MC is formed.

Each memory cell MC has a barrier metal EL3, a non-ohmic element NO (first non-ohmic element), a lower electrode EL2, a variable resistance element VR (first variable resistance element), and an upper electrode EL1 (first upper electrode) which are laminated and formed in order from the word line WL to the bit line BL. Among them, a portion from the barrier metal EL3 to the variable resistance element VR is formed in a pillar shape. The upper electrode EL1 is formed continuously on multiple memory cells MC arranged in the Y direction (second direction).

On these multiple bit lines BL, multiple upper layer word lines WL' (third wires) extending in the X direction are formed. Further, at each crossing point between the multiple word lines WL' and the multiple bit lines BL, an upper layer memory cell MC' is formed.

Each memory cell MC' has a barrier metal EL3', a non-ohmic element NO' (second non-ohmic element), a lower electrode EL2', a variable resistance element VR' (second variable resistance element), and an upper electrode EL1' (second upper electrode) which are laminated and formed in order from the bit line BL to the word line WL'. Among them, a portion from the barrier metal EL3' to the variable resistance element VR' is formed in a pillar shape. The upper electrode EL1' is formed continuously on multiple memory cells MC' arranged in the Y direction.

Interlayer insulating films 210 are respectively formed between multiple memory cells MC adjacent to each other in the Y direction. Likewise, interlayer insulating films 221 are respectively formed between multiple memory cells MC' adjacent to each other in the Y direction. Likewise, interlayer insulating films 217 are respectively formed between multiple memory cells MC adjacent to each other in the X direction, between multiple bit lines BL adjacent to each other in the X direction, and between multiple memory cells MC' adjacent to each other in the X direction.

<Method for Manufacturing Memory Cell Array>

Subsequently, the method for manufacturing the memory cell array 1 as shown in FIGS. 11A and 11B will be explained with reference to cross sectional views of the memory cell array 1 as shown in FIGS. 12 to 17A and 17B. In this explanation, the non-ohmic elements NO and NO' are diode.

First, CMOS transistors of a peripheral circuit and the like are formed on a silicon substrate, not shown. Then, an interlayer insulating film 201, a metallic wire material 203' (film which is made into a first wire) such as W, WN which is made into word lines WL, a barrier metal material 204" such as TiN which is made into barrier metals EL3, a diode material 205' (film which is made into a first non-ohmic element) formed by laminating N+Ploy Si/N−Poly Si/P+Poly Si in order, which is made into diodes (non-ohmic elements NO), and a metallic electrode material 206" which is made into lower electrodes EL2 are deposited in order. It should be noted that the diode material 205' may be formed by laminating P+Poly Si/N−Poly Si/N+Poly Si in order.

Figure 12:
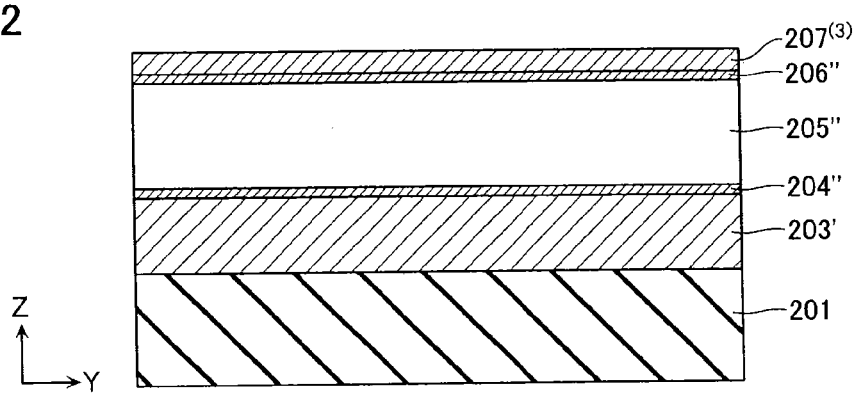
FIG. 12 is a figure illustrating a step of manufacturing the memory cell array of the nonvolatile semiconductor storage device according to the embodiment.

Thereafter, a metallic element material 207$^{(3)}$ (film which is made into a first variable resistance element), which is made into the variable resistance elements VR, is deposited on the metallic electrode material 206". This metallic element material 207$^{(3)}$ has such property that the metallic element material 207$^{(3)}$ changes into a resistance-change material when oxidized. For example, Hf, Ni, Mn, and Ti can be used as the metallic element material 207$^{(3)}$. As a result of the above manufacturing steps, the cross section of the memory cell array 1 becomes what is shown in FIG. 12.

Figure 13:
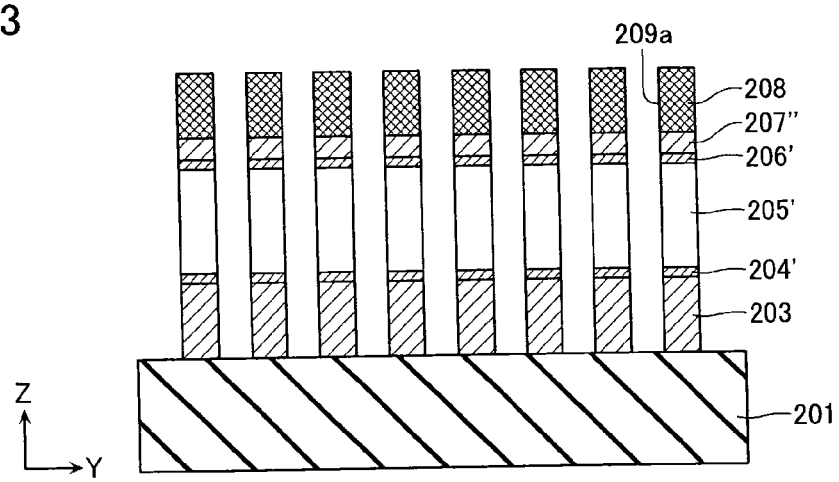
FIG. 13 is a figure illustrating a step of manufacturing the memory cell array of the nonvolatile semiconductor storage device according to the embodiment.

Subsequently, a mask material 208 is deposited that is required to process the metallic wire material 203', the barrier metal material 204", the diode material 205", the metallic electrode material 206", and the metallic element material 207$^{(3)}$. Thereafter, this mask material 208 is patterned into an L/S pattern arranged in the Y direction by photolithography. Subsequently, multiple grooves 209a extending in the X direction are formed by anisotropic etching in the metallic element material 207$^{(3)}$, the metallic electrode material 206", the diode material 205", the barrier metal material 204", and the metallic wire material 203', so that metallic element materials 207", metallic electrode materials 206', diode materials 205', barrier metal materials 204', and metallic wire materials 203, which are divided into multiple pieces in the Y direction, are formed. Among them, the multiple metallic wire materials 203 divided in the Y direction are made into word lines WL. As a result of the above manufacturing steps, the cross section of the memory cell array 1 becomes what is shown in FIG. 13.

Figure 14:
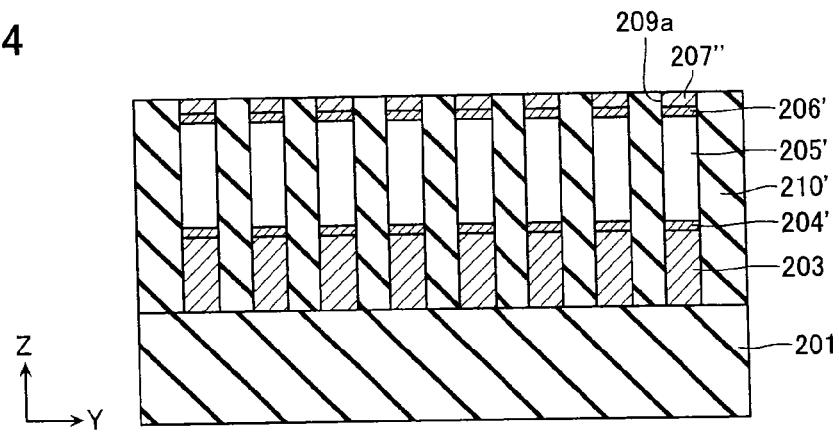
FIG. 14 is a figure illustrating a step of manufacturing the memory cell array of the nonvolatile semiconductor storage device according to the embodiment.
Figure 15:
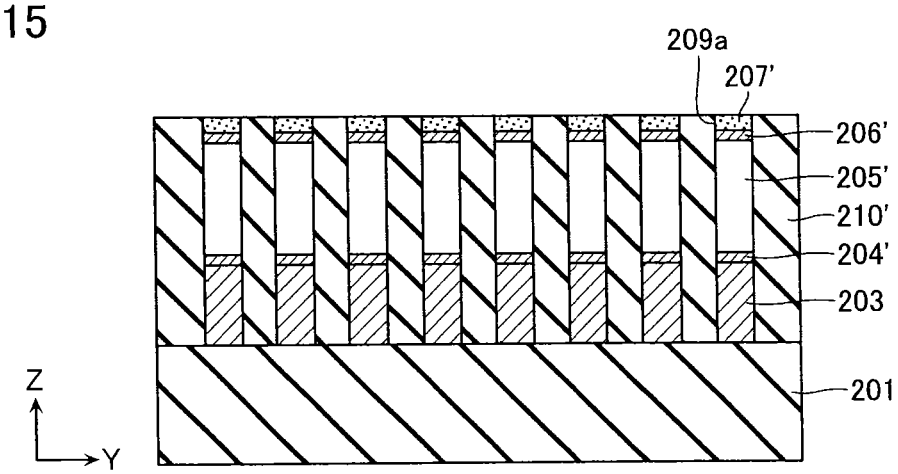
FIG. 15 is a figure illustrating a step of manufacturing the memory cell array of the nonvolatile semiconductor storage device according to the embodiment.

Subsequently, the interlayer insulating film 210' such as HDP-USG and PSZ is embedded in the grooves 209a formed by the previous anisotropic etching. Subsequently, using the metallic element material 207" as a stopper, the mask material 208 and the interlayer insulating film 210' are smoothed until the upper surface of the metallic element material 207" is exposed. As a result of the above manufacturing steps, the cross section of the memory cell array 1 becomes what is shown in FIG. 14.

Subsequently, as shown in FIG. 8, the metallic element material 207' such as Hf, Ni, Mn, and Ti is oxidized by thermal oxidation and radical oxidation, and a resistance-change material 207' such as HfO$_2$, NiO$_2$, MnO, and TiO$_2$ is formed. Like the first embodiment, the entire metallic element material 207" may be oxidized, or a portion thereof may be oxidized.

Figure 16A:
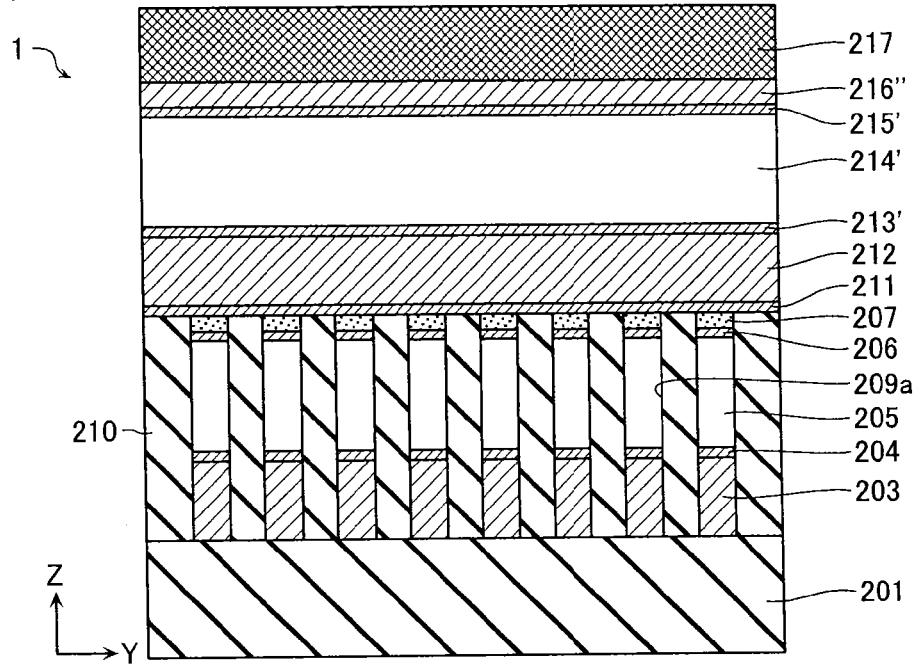
FIG. 16A is a figure illustrating a step of manufacturing the memory cell array of the nonvolatile semiconductor storage device according to the embodiment.
Figure 16B:
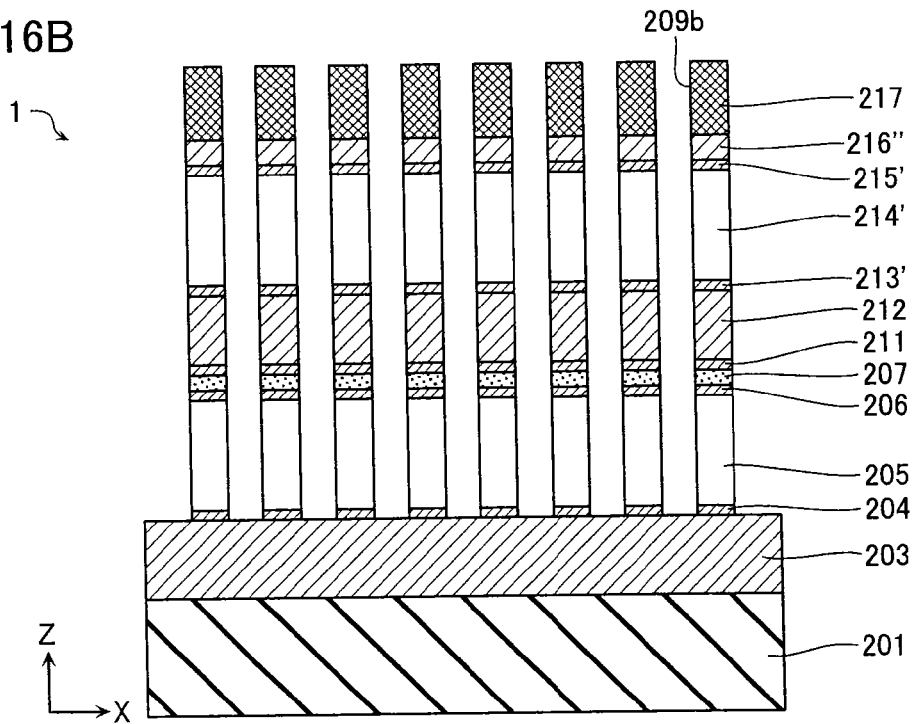
FIG. 16B is a figure illustrating a step of manufacturing the memory cell array of the nonvolatile semiconductor storage device according to the embodiment.

Subsequently, a metallic electrode material 211' (film which is made into a first upper electrode) such as Ti, TiN which is made into the upper electrodes EL1 and a metallic wire material 212' (film which is made into a second wire) such as W, WN which is made into the bit lines BL are deposited on the resistance-change material 207' and the layer insulating film 210'. Further, a barrier metal material 213" which is made into barrier metals EL3', a diode material 214" (film which is made into a second non-ohmic element) formed by laminating P+Ploy Si/N−Poly Si/N+Poly Si in order, which is made into diodes, a metallic electrode material 206" which is made into lower electrodes EL2', and a metallic element material 216$^{(3)}$ (film which is made into a second variable resistance element) which is made into the variable resistance elements VR are deposited on the metallic wire material 212'. Subsequently, a mask material 217 is deposited that is required to process the metallic electrode material 204', the diode material 205', . . . , the metallic element material 216$^{(3)}$. Thereafter, this mask material 217 is patterned into an L/S pattern arranged in the X direction by photolithography. Subsequently, multiple grooves 209b extending in the X direction are formed by anisotropic etching in the metallic element material 216$^{(3)}$, the metallic electrode material 215", . . . , and the metallic electrode material 204', so that metallic element materials 216", metallic electrode materials 215', . . . , metallic electrode materials 204, which are divided into multiple pieces in the X direction, are formed. As a result, the memory cells MC and bit lines BL of the lower layer are formed. As a result of the above manufacturing steps, the cross section of the memory cell array 1 taken along Y-Z and the cross section of the memory cell array 1 taken along X-Z become what are shown in FIGS. 16A and 16B, respectively.

Subsequently, the interlayer insulating film 217 is embedded in the grooves 209b formed by the previous anisotropic etching. Subsequently, using the metallic element material 216" as a stopper, the mask material 217 is smoothed until the upper surface of the metallic element material 216" is exposed. Subsequently, a portion or all of the metallic element material 216" exposed on the upper surface is oxidized, so that a resistance-change material 216' is formed. As a result of the above manufacturing steps, the cross section of the memory cell array 1 taken along Y-Z and the cross section of the memory cell array 1 taken along X-Z become what are shown in FIGS. 17A and 17B, respectively.

Subsequently, a metallic electrode material 218' (film which is made into a second upper electrode) which is made into upper electrodes EL1' and a metallic wire material 219' (film which is made into a third wire) which is made into word line WL' are deposited on the resistance-change material 216'. Subsequently, when multiple grooves 220 extending in the X direction are formed in the metallic wire material 219', the metallic electrode material 218', . . . , barrier metal material 213', and an interlayer insulating films 221 are embedded into the multiple grooves 220, a memory cell array 11 as shown in FIGS. 11A and 11B is completed.

Figure 17A:
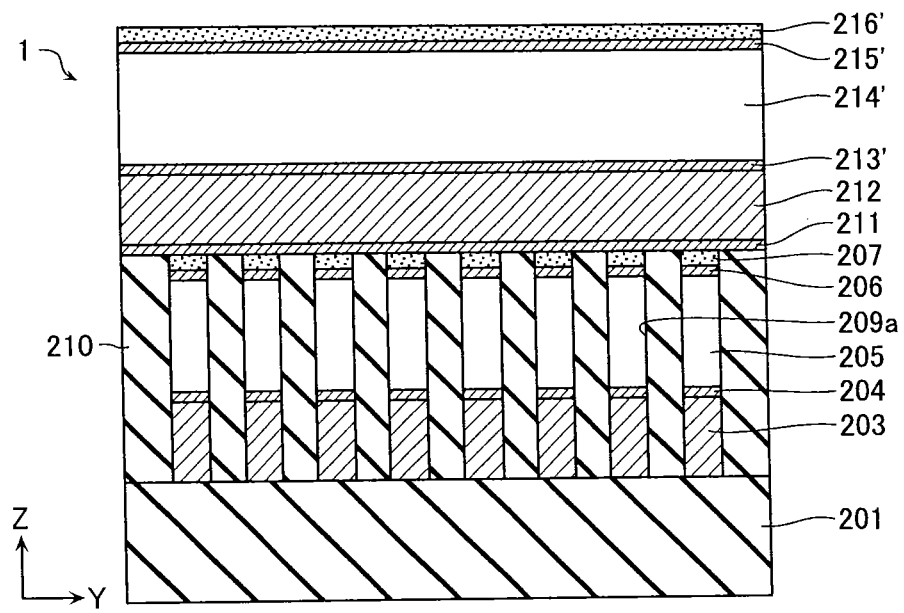
FIG. 17A is a figure illustrating a step of manufacturing the memory cell array of the nonvolatile semiconductor storage device according to the embodiment.
Figure 17B:
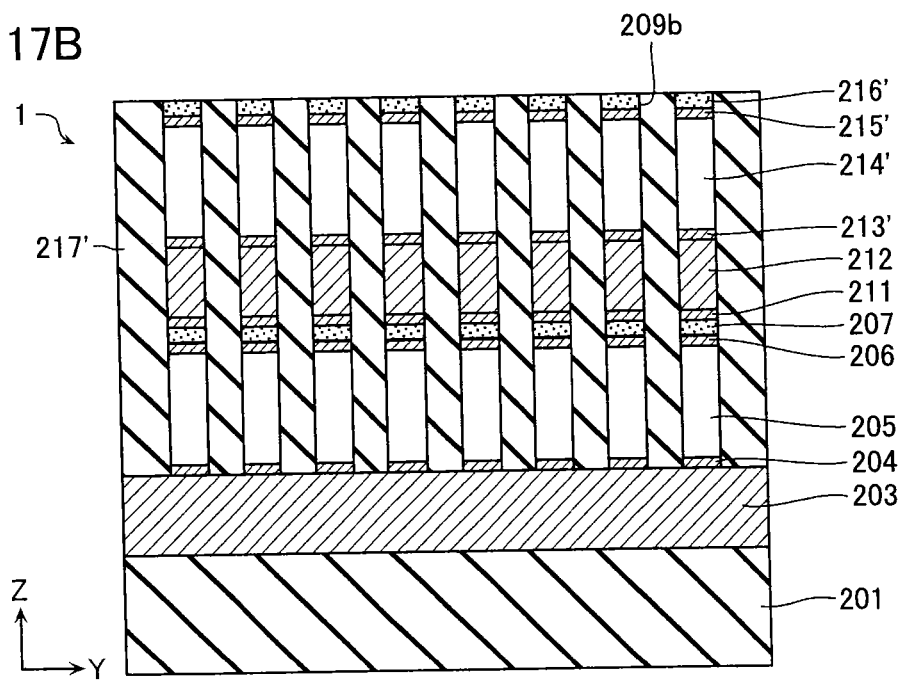
FIG. 17B is a figure illustrating a step of manufacturing the memory cell array of the nonvolatile semiconductor storage device according to the embodiment.

It should be noted that a memory cell array 1 having a desired number of memory cell layers can be manufactured by repeating the same manufacturing steps as those explained with reference to FIGS. 12 to 17A and 17B after the manufacturing steps as shown in FIGS. 17A and 17B.

As described above, according to the present embodiment, the memory cells in the upper layer to the memory cells in the lower layer can be processed by the anisotropic etching performed at a time, and therefore, as compared with the first embodiment, the manufacturing steps can be simplified, e.g., the number of times of lithography can be reduced. Even in this case, the metallic element material which is made into the variable resistance elements is used as the stopper during the anisotropic etching, and therefore, the same effects as those of the first embodiment can be obtained.

Third Embodiment

In the first and second embodiments, the nonvolatile semiconductor storage device using the variable resistance element including one resistance-change material has been explained. In the third embodiment, a nonvolatile semiconductor storage device using a variable resistance element made by laminating multiple resistance-change materials will be explained.

<Structure of Memory Cell Array>

Figure 18A:
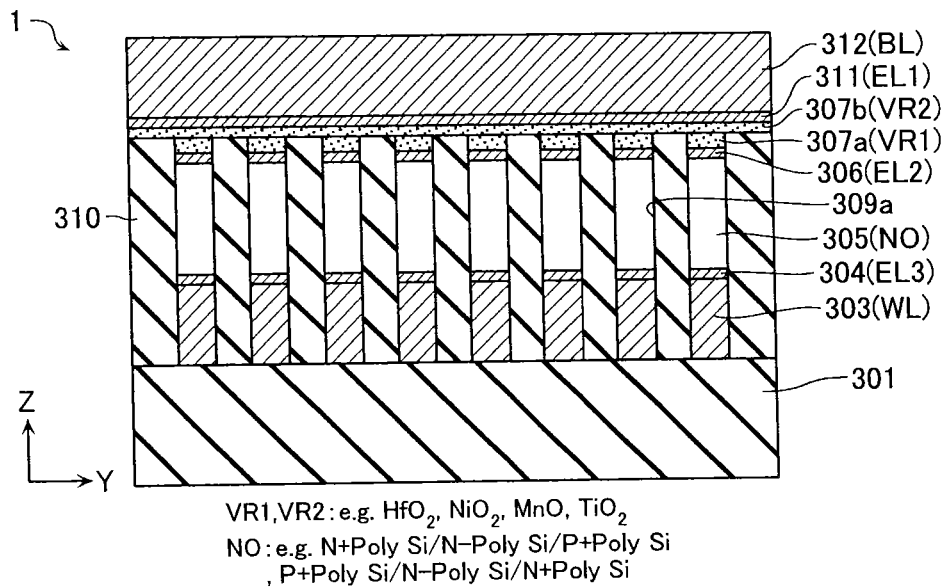
FIG. 18A is a cross sectional view illustrating a memory cell array of a nonvolatile semiconductor storage device according to a third embodiment.
Figure 18B:
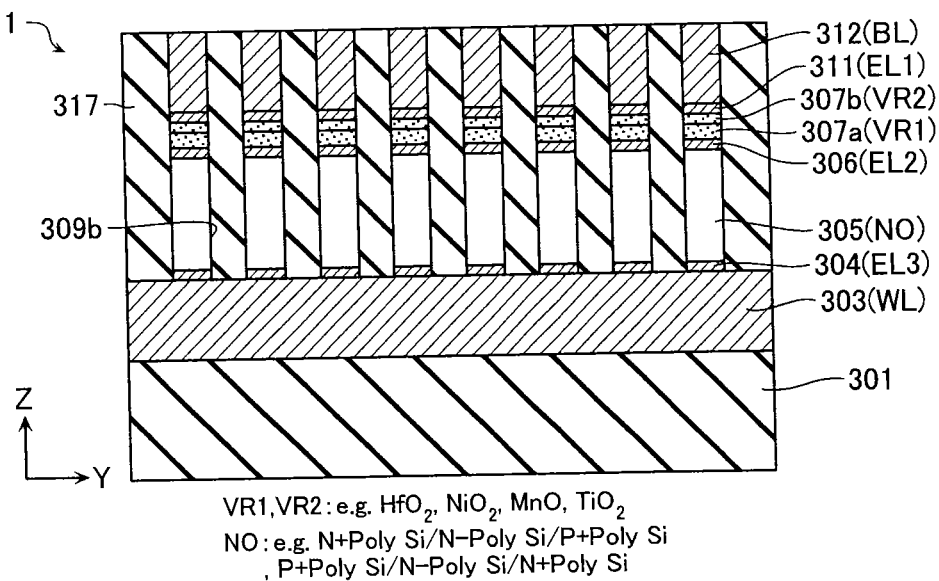
FIG. 18B is a cross sectional view illustrating the memory cell array of the nonvolatile semiconductor storage device according to the embodiment.

FIGS. 18A and 18B are cross sectional views illustrating a portion of a memory cell array 1 of a nonvolatile semiconductor storage device according to the third embodiment. FIG. 18A is a cross section of the memory cell array 1 taken along Y-Z. FIG. 18B is a cross section of the memory cell array 1 taken along X-Z.

The memory cell array 1 according to the present embodiment includes an interlayer insulating film 301 formed on a silicon substrate (not shown) formed with CMOS transistors of a peripheral circuit and the like. On the interlayer insulating film 301, multiple word lines WL (first wires) extending in the X direction (first direction) are formed.

On these multiple word lines WL, multiple bit lines BL (second wires) extending in the Y direction (second direction) are formed. Further, at each crossing point between the multiple word lines WL and the multiple bit lines BL, a memory cell MC is formed.

Each memory cell MC has a barrier metal EL3, a non-ohmic element NO, a lower electrode EL2, a variable resistance element VR made by laminating a resistance-change material VR1 (first resistance-change material) and a resistance-change material VR2 (second resistance-change material), and an upper electrode EL1 which are laminated and formed in order from the word line WL to the bit line BL. Among them, a laminated layer body from the barrier metal EL3 to the resistance-change material VR1 of the variable resistance element VR is formed in a pillar shape. The resistance-change material VR2 of the variable resistance element VR and upper electrode EL1 are respectively formed continuously on multiple memory cells MC arranged in the Y direction.

Interlayer insulating films 310 are respectively formed between multiple memory cells MC adjacent to each other in the Y direction. Interlayer insulating films 317 are respectively formed between multiple memory cells MC adjacent to each other in the X direction.

<Method for Manufacturing Memory Cell Array>

Subsequently, the method for manufacturing the memory cell array 1 as shown in FIGS. 18A and 18B will be explained with reference to cross sectional views of the memory cell array 1 as shown in FIGS. 19 to 24A and 24B. In this explanation, the non-ohmic element NO is a diode.

First, CMOS transistors of a peripheral circuit and the like are formed on a silicon substrate, not shown. Then, an interlayer insulating film 301, a metallic wire material 303' (film which is made into a first wire) such as W, WN which is made into word lines WL, a barrier metal material 304" such as TiN which is made into barrier metals EL3, a diode material 305" (film which is made into a first non-ohmic element) formed by laminating P+Poly Si/N−Poly Si/N+Poly Si in order, which is made into diodes (non-ohmic elements NO), a metallic electrode material 306" such as Ti, TiN, N+Poly Si which is made into lower electrodes EL2 are deposited in order.

Figure 19:
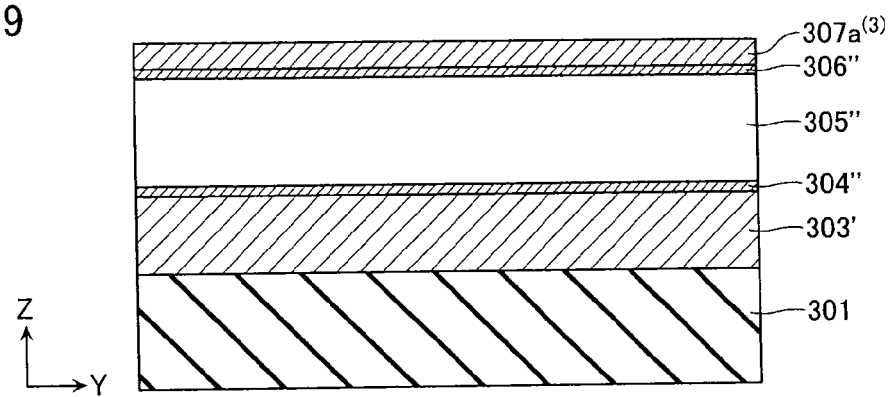
FIG. 19 is a figure illustrating a step of manufacturing the memory cell array of the nonvolatile semiconductor storage device according to the embodiment.

Thereafter, a metallic element material $307a^{(3)}$ (film which is made into a first variable resistance element), which is made into the resistance-change material VR1 of the variable resistance element VR, is deposited on the metallic electrode material 306". This metallic element material $307a^{(3)}$ has such property that the metallic element material $307a^{(3)}$ changes into a resistance-change material when oxidized. For example, Hf and the like can be used as the metallic element material $307a^{(3)}$. As a result of the above manufacturing steps, the cross section of the memory cell array 1 becomes what is shown in FIG. 19.

Figure 20:
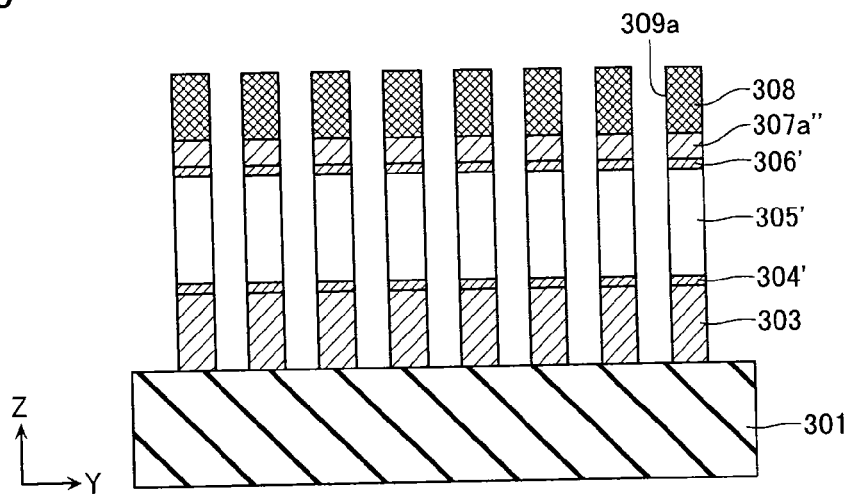
FIG. 20 is a figure illustrating a step of manufacturing the memory cell array of the nonvolatile semiconductor storage device according to the embodiment.

Subsequently, a mask material 308 is deposited that is required to process the metallic wire material 303', the barrier metal material 304", the diode material 305", the metallic electrode material 306", and the metallic element material $307a^{(3)}$. Thereafter, this mask material 308 is patterned into an L/S pattern arranged in the Y direction by photolithography. Subsequently, multiple grooves 309a extending in the X direction are formed by anisotropic etching in the metallic element material $307a^{(3)}$, the metallic electrode material 306", . . . , the metallic wire material 303', so that metallic element materials 307", metallic electrode materials 306', . . . , metallic wire materials 303, which are divided into multiple pieces in the Y direction, are formed. Among them, the multiple metallic wire materials 303 divided in the Y direction are made into word lines WL. As a result of the above manufacturing steps, the cross section of the memory cell array 1 becomes what is shown in FIG. 20.

Figure 21:
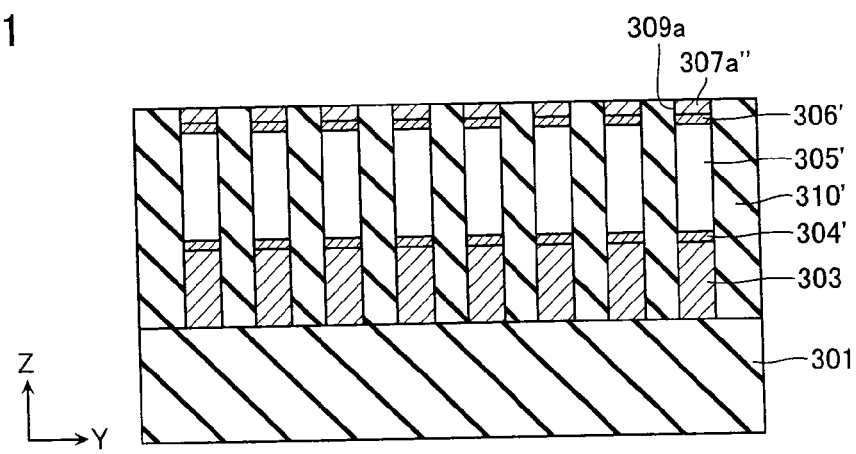
FIG. 21 is a figure illustrating a step of manufacturing the memory cell array of the nonvolatile semiconductor storage device according to the embodiment.

Subsequently, the interlayer insulating film 310' such as HDP-USG and PSZ is embedded in the grooves 309a formed by the previous anisotropic etching. Subsequently, using the metallic element material 307a" as a stopper, the mask material 308 and the interlayer insulating film 310' are smoothed until the upper surface of the metallic element material 307a" is exposed. As a result of the above manufacturing steps, the cross section of the memory cell array 1 becomes what is shown in FIG. 21.

Figure 22:
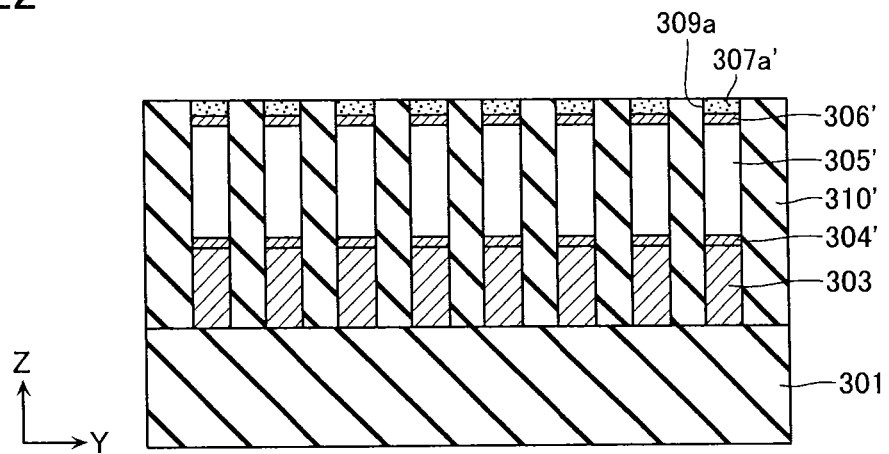
FIG. 22 is a figure illustrating a step of manufacturing the memory cell array of the nonvolatile semiconductor storage device according to the embodiment.

Subsequently, as shown in FIG. 22, the metallic element material 307a" such as Hf is oxidized by thermal oxidation and radical oxidation, and a resistance-change material 307a' such as HfO$_2$ is formed. Similar to the first and second embodiments, the entire metallic element material 307a' may be oxidized, or a portion thereof may be oxidized.

Figure 23:
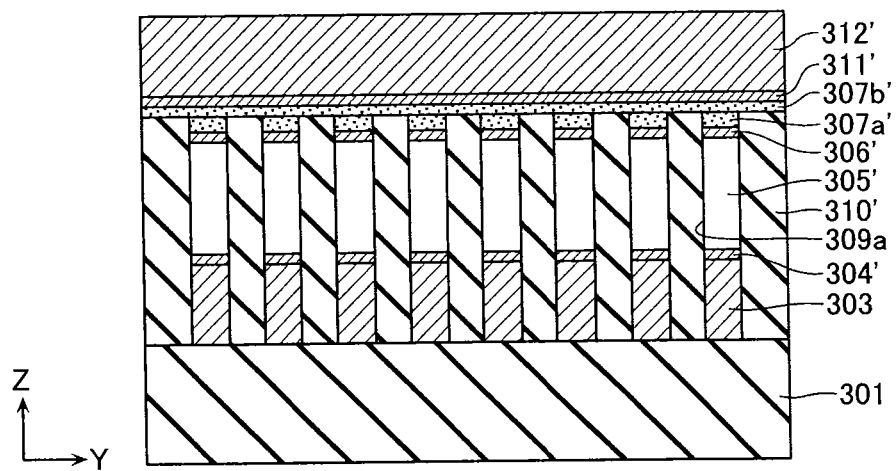
FIG. 23 is a figure illustrating a step of manufacturing the memory cell array of the nonvolatile semiconductor storage device according to the embodiment.

Subsequently, a resistance-change material 307b' such as TiO$_2$ which is made into resistance-change materials VR2, a metallic electrode material 311' (film which is made into a first upper electrode) such as TiN which is made into upper electrodes EL1, and a metallic wire material 312' (film which is made into a second wire) such as W, WN which is made into bit lines BL are deposited on the resistance-change material 307a' and the interlayer insulating film 310'. As a result of the above manufacturing steps, the cross section of the memory cell array 1 becomes what is shown in FIG. 23.

Figure 24A:
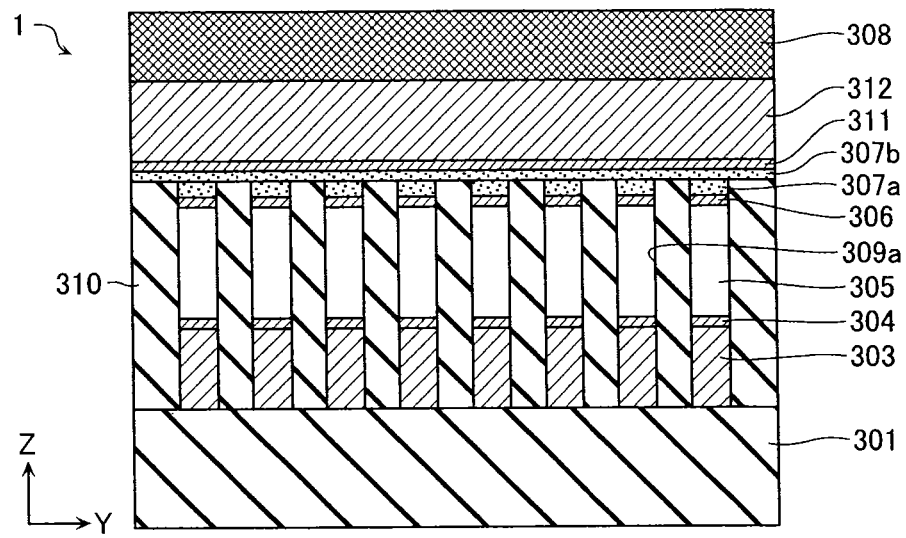
FIG. 24A is a figure illustrating a step of manufacturing the memory cell array of the nonvolatile semiconductor storage device according to the embodiment.
Figure 24B:
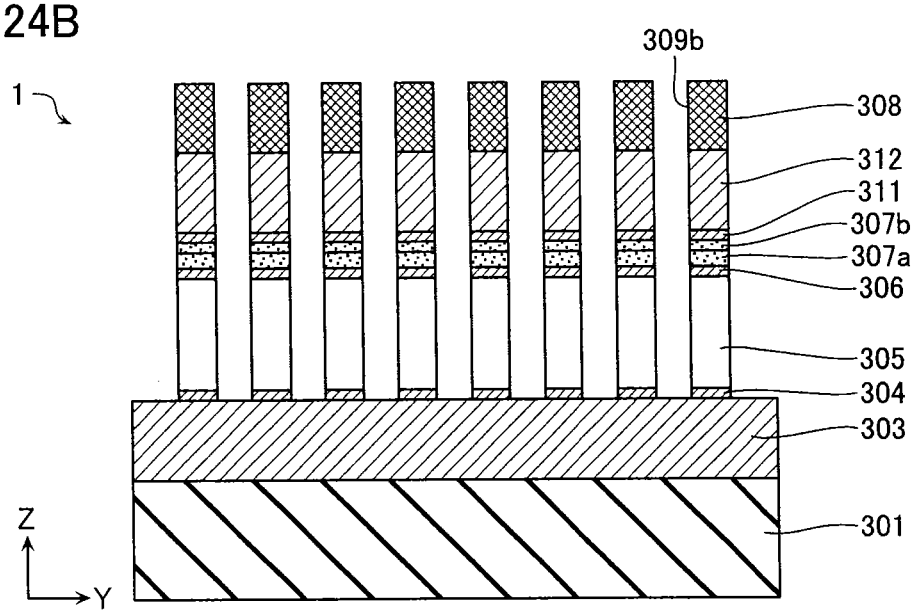
FIG. 24B is a figure illustrating a step of manufacturing the memory cell array of the nonvolatile semiconductor storage device according to the embodiment.

Subsequently, a mask material 308 is deposited that is required to process the metallic electrode material 304', the diode material 305', . . . , and the metallic wire material 312'. Thereafter, this mask material 308 is patterned into an L/S pattern arranged in the X direction by photolithography. Subsequently, multiple grooves 309b extending in the X direction are formed by anisotropic etching in the metallic wire material 312', the metallic electrode material 311', . . . , the metallic electrode material 304', so that metallic wire materials 312, metallic electrode materials 311, . . . , metallic electrode materials 304, which are divided into multiple pieces in the X direction, are formed. As a result, the memory cells MC and bit lines BL are formed. As a result of the above manufacturing steps, the cross section of the memory cell array 1 taken along Y-Z and the cross section of the memory cell array 1 taken along X-Z become what are shown in FIGS. 24A and 24B, respectively.

Subsequently, the interlayer insulating film 317 is embedded in the grooves 309b formed by the previous anisotropic etching. Subsequently, when smoothed until the upper surface of the metallic wire material 312 is exposed, the memory cell array 1 as shown in FIGS. 18A and 18B is completed.

It should be noted that a memory cell array 1 having a desired number of memory cell layers can be manufactured by further repeating the manufacturing steps as shown in FIGS. 19 to 23 after the above manufacturing steps.

As described above, according to the present embodiment, the same effects as those of the first embodiment can be obtained by using the metallic element material serving as the resistance-change material at the lower layer side constituting the variable resistance element as a stopper during the anisotropic etching even when a nonvolatile semiconductor storage device using a variable resistance element formed by laminating multiple resistance-change materials is manufactured.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for manufacturing a nonvolatile semiconductor storage device, comprising:
    laminating a first wire extending in a first direction, a film made into a first non-ohmic element, and a film made into a first variable resistance element made of a metallic material, which are laminated in order on a semiconductor substrate extending in the first direction and a second direction intersecting the first direction;
    dividing, into a plurality of pieces, the film made into the first variable resistance element and the film made into the first non-ohmic element, in the first direction and the second direction;
    forming a first interlayer insulating film between the plurality of pieces formed by dividing the film made into the first variable resistance element and the film made into the first non-ohmic element in the first direction and the second direction;
    planarizing an upper surface of the first interlayer insulating film and the film made into the first variable resistance element;
    oxidizing the metallic material of the film made into the first variable resistance element; and
    laminating a first upper electrode extending in the second direction and a second wire extending in the second direction, which are laminated in order on the film made into the first variable resistance element and the first interlayer insulating film.

2. The method for manufacturing the nonvolatile semiconductor storage device according to claim 1, comprising:
    after the first upper electrode and the second wire are laminated, forming a second interlayer insulating film between a plurality of pieces of the second wire and the first upper electrode;
    depositing a third interlayer insulating film on the second wire and the second interlayer insulating film,
    after the third interlayer insulating film is depositing, repeating one or more times, on the third interlayer insulating film, from the laminating the first wire, the film made into the first non-ohmic element, and the film made into the first variable resistance element to the depositing the third interlayer insulating film.

3. The method for manufacturing the nonvolatile semiconductor storage device according to claim 1,
    wherein when the metallic material of the film made into the first variable resistance element is oxidized, a portion of the metallic material or all of the metallic material is oxidized.

4. The method for manufacturing the nonvolatile semiconductor storage device according to claim 1,
    wherein when the film made into the first non-ohmic element is laminated, N+Poly Si/N−Poly Si/P+Poly Si are laminated in order, or P+Poly Si/N−Poly Si/N+Poly Si are laminated in order.

5. The method for manufacturing the nonvolatile semiconductor storage device according to claim 1,
    wherein the metallic material is any one of hafnium, nickel, manganese, and titanium.

6. The method for manufacturing the nonvolatile semiconductor storage device according to claim 1,
    wherein the metallic material of the film made into the first variable resistance element is oxidized by thermal oxidation and radical oxidation.

7. The method for manufacturing the nonvolatile semiconductor storage device according to claim 1,
    wherein after the metallic material of the film made into the first variable resistance element is oxidized but before the second upper electrode is laminated, a resistance-change material, which becomes a portion of the first variable resistance element, is laminated on the film made into the first variable resistance element.

8. A method for manufacturing a nonvolatile semiconductor storage device comprising:
    laminating a first wire extending in a first direction, a film made into a first non-ohmic element, and a film made into a first variable resistance element made of a metallic material, which are laminated in order on a semiconductor substrate extending in the first direction and a second direction intersecting the first direction;
    dividing, into a plurality of pieces, the film made into the first variable resistance element and the film made into the first non-ohmic element, in the first direction;
    forming a first interlayer insulating film between the plurality of pieces formed by dividing the film made into the first variable resistance element and the film made into the non-ohmic element in the first direction;
    planarizing an upper surface of the film made into the first variable resistance element and the first interlayer insulating film;
    oxidizing the metallic material of the film made into the first variable resistance element;
    laminating a film made into a first upper electrode and a film made into a second wire, which are laminated in order on the film made into the first variable resistance element and the first interlayer insulating film;
    laminating a film made into a second non-ohmic element and a film made into a second variable resistance element made of a metallic material, which are laminated in order on the film made into the second wire;

dividing, into a plurality of pieces, the film made into the second variable resistance element, the film made into the second non-ohmic element, the film made into the second wire, the film made into the first upper electrode, the film made into the first variable resistance element, and the film made into the first non-ohmic element, in the second direction;

forming a second interlayer insulating film between the plurality of pieces formed by dividing the film made into the second variable resistance element, the film made into the second non-ohmic element, the film made into the second wire, the film made into the first upper electrode, the film made into the first variable resistance element, and the film made into the first non-ohmic element, in the second direction;

planarizing an upper surface of the film made into the second variable resistance element and the second interlayer insulating film;

oxidizing the metallic material of the film made into the second variable resistance element; and laminating a film made into a second upper electrode and a film made into a third wire, which are laminated in order on the film made into the second variable resistance element and the second interlayer insulating film.

9. The method for manufacturing the nonvolatile semiconductor storage device according to claim 8, wherein when the metallic material of the film made into the first variable resistance element is oxidized, a portion of the metallic material or all of the metallic material is oxidized.

10. The method for manufacturing the nonvolatile semiconductor storage device according to claim 8, wherein when the film made into the first non-ohmic element is laminated, N+Poly Si/N−Poly Si/P+Poly Si are laminated in order, or P+Poly Si/N−Poly Si/N+Poly Si are laminated in order.

11. The method for manufacturing the nonvolatile semiconductor storage device according to claim 10, wherein when the film made into the second non-ohmic element is laminated, N+Poly Si, N−Poly Si, and P+poly Si are laminated in reverse order for the laminating the film made into the first non-ohmic element.

12. The method for manufacturing the nonvolatile semiconductor storage device according to claim 8, wherein the metallic material is any one of hafnium, nickel, manganese, and titanium.

13. The method for manufacturing the nonvolatile semiconductor storage device according to claim 8, wherein the metallic material of the film made into the first variable resistance element is oxidized by thermal oxidation and radical oxidation.

* * * * *

UNITED STATES PATENT AND TRADEMARK OFFICE
CERTIFICATE OF CORRECTION

PATENT NO.       : 9,166,164 B2
APPLICATION NO.  : 14/482893
DATED            : October 20, 2015
INVENTOR(S)      : Toshiharu Tanaka It is certified that error appears in the above-identified patent and that said Letters Patent is hereby corrected as shown below:

On the title page, Item (73), the Assignee's Information is incorrect. Item (73) should read:

--(73)  Assignee:  KABUSHIKI KAISHA TOSHIBA, Minato-ku (JP)--

Signed and Sealed this
Third Day of May, 2016

Michelle K. Lee
*Director of the United States Patent and Trademark Office*